(12) United States Patent
Kumakura et al.

(10) Patent No.: US 12,125,710 B2
(45) Date of Patent: Oct. 22, 2024

(54) SUBSTRATE PROCESSING METHOD AND SUBSTRATE PROCESSING APPARATUS

(71) Applicant: Tokyo Electron Limited, Tokyo (JP)

(72) Inventors: Sho Kumakura, Miyagi (JP); Yusuke Takino, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 13 days.

(21) Appl. No.: 17/586,251

(22) Filed: Jan. 27, 2022

(65) Prior Publication Data
US 2022/0246440 A1 Aug. 4, 2022

(30) Foreign Application Priority Data

Jan. 29, 2021 (JP) .................. 2021-013072

(51) Int. Cl.
H01L 21/311 (2006.01)
H01J 37/32 (2006.01)
H01L 21/3065 (2006.01)

(52) U.S. Cl.
CPC .. *H01L 21/31144* (2013.01); *H01J 37/32449* (2013.01); *H01L 21/3065* (2013.01); *H01L 21/31116* (2013.01); *H01J 2237/334* (2013.01)

(58) Field of Classification Search
None
See application file for complete search history.

(56) References Cited

U.S. PATENT DOCUMENTS

2009/0068826 A1* 3/2009 Taniguchi ........... H01L 21/0338
438/585
2016/0343580 A1 11/2016 Hudson
2021/0202233 A1* 7/2021 Niizeki ............. H01L 21/67109

FOREIGN PATENT DOCUMENTS

JP H08-191062 A 7/1996
JP 2007-266291 A 10/2007
JP 2013-191674 A 9/2013

* cited by examiner

*Primary Examiner* — Stephanie P Duclair
(74) *Attorney, Agent, or Firm* — XSENSUS LLP

(57) ABSTRACT

A substrate processing method includes: (a) providing a substrate including an etching target film, a first mask formed on the etching target film, and a second mask formed on the first mask, the second mask being different in film type from the first mask and having an opening; (b) selectively etching the first mask with respect to the second mask, thereby forming an opening in the first mask such that an opening dimension of at least a portion of the first mask is larger than an opening dimension of a bottom of the second mask; and (c) etching the etching target film.

17 Claims, 6 Drawing Sheets

SUBSTRATE PROCESSING METHOD AND SUBSTRATE PROCESSING APPARATUS

CROSS-REFERENCE TO RELATED APPLICATIONS

This application is based on and claims priority from Japanese Patent Application No. 2021-013072, filed on Jan. 29, 2021, with the Japan Patent Office, the disclosure of which is incorporated herein in its entirety by reference.

TECHNICAL FIELD

The present disclosure relates to a substrate processing method and a substrate processing apparatus.

BACKGROUND

As the integration of semiconductor devices progresses not only in the horizontal direction but also in the vertical direction, the aspect ratio of a pattern formed in a process of manufacturing the semiconductor device also increases. For example, in manufacturing a 3D NAND, channel holes are formed in a direction penetrating a large number of metal wiring layers. When a 64-layer memory cell is formed, the aspect ratio of each channel hole becomes 45.

Various methods have been proposed for forming a pattern having a high aspect ratio with a high accuracy. For example, a method has been proposed which repeatedly performs an etching and a film formation in an opening formed in a dielectric material of a substrate, thereby suppressing an etching in a horizontal direction (U.S. Patent Application Publication No. 2016/0343580).

SUMMARY

According to an aspect of the present disclosure, a substrate processing method includes: (a) providing a substrate including an etching target film, a first mask formed on the etching target film, and a second mask formed on the first mask, the second mask being different in film type from the first mask and having an opening; (b) selectively etching the first mask with respect to the second mask, thereby forming an opening in the first mask such that an opening dimension of at least a portion of the first mask is larger than an opening dimension of a bottom of the second mask; and (c) etching the etching target film.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of a substrate processing method and a substrate processing apparatus of the present disclosure will be described in detail based on the drawings. The present disclosure is not limited to the embodiments.

In the descriptions herein below, a "pattern" refers to all shapes formed on a substrate. The pattern indicates all of a plurality of shapes formed on a substrate such as, for example, holes, trenches, and line-and-space. An "opening" refers to a portion corresponding to a shape dented in a thickness direction of the substrate, in a pattern formed on the substrate. The opening has a "side wall" which is the inner peripheral surface of the dented shape, a "bottom" which is the bottom of the dented shape, and a "top" which is continuous with the side wall and is the surface of the substrate near the side wall. The horizontal dimension of the space formed by the opening will be referred to as an "opening dimension." The term "opening" is also used to indicate the entire space surrounded by the bottom and the side wall or any position in the space.

The "vertical direction" refers to the film thickness direction of a plurality of films formed on a substrate. The vertical direction is substantially perpendicular to the surface of the substrate. The "horizontal direction" refers to a direction parallel to the surface of the substrate. The horizontal direction is substantially perpendicular to the vertical direction. Each of the vertical direction and the horizontal direction may not indicate exactly one direction, and includes certain tolerances.

When a vertical pattern with a relatively high aspect ratio is etched in an etching target film, it is believed that an opening of a mask also preferably has a vertical shape at the bottom thereof, rather than a tapered shape. However, for example, a protective film or deposits produced during an etching may adhere to the portion of the etching target film directly below the mask, and thus, a bar critical dimension (Bar-CD) of the portion may increase. The Bar-CD indicates the dimension of a portion remaining without being etched (hereinafter, also referred to as a bar). The dimension of an etched opening will be referred to as a space critical dimension (Space-CD). Accordingly, it is expected to improve the vertical processability of the pattern formed on the substrate, and suppress the shape abnormality of the pattern.

[CDs in Cases Where a Vertical Mask and a Tapered Mask are Used]

Figure 1A:
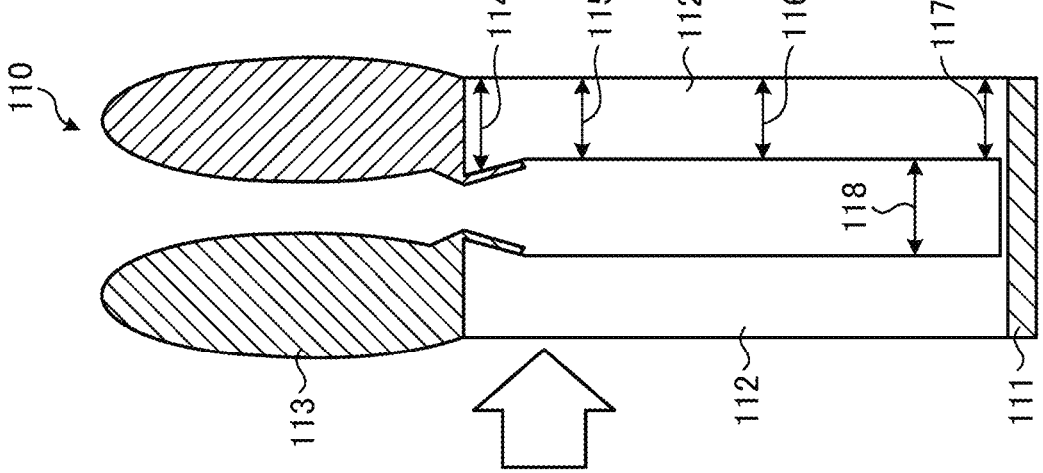
FIGS. 1A and 1B are views illustrating examples of a critical dimension (CD) in cases where a vertical mask and a tapered mask are used.
Figure 1B:
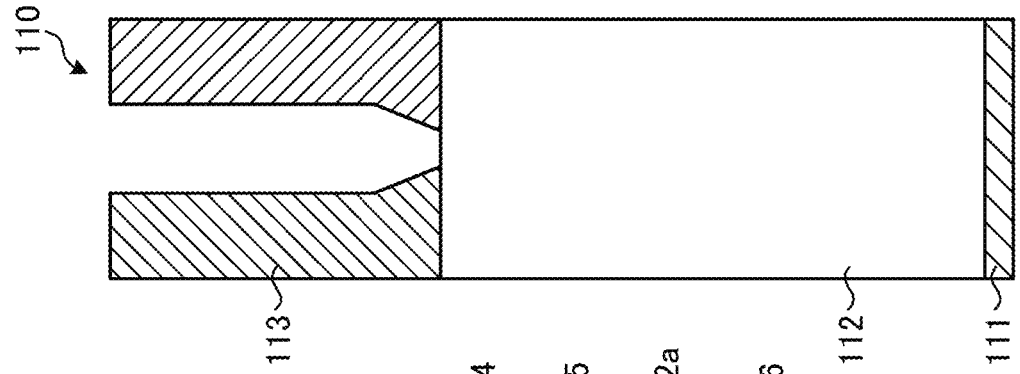

First, CDs in cases where a vertical mask and a tapered mask are used will be described with reference to FIGS. 1A and 1B. FIGS. 1A and 1B are views illustrating examples of CDs in cases where a vertical mask and a tapered mask are used. FIG. 1A illustrates a case where a vertical mask is used. In a substrate 100 illustrated in FIG. 1A, an etching target film 102 and a mask 103 are formed on a base film 101. The mask 103 has a vertical side wall at the bottom of the opening. When an etching is performed on the substrate 100, a bar 102a of the etching target film 102 has a shape in which a CD 104 directly below the mask 103 and a CD 105 of the upper portion are larger than a CD 106 of the middle portion and a CD 107 of the bottom. Here, the CDs 104 to 107 are Bar-CDs, and a CD 108 of the etched hole is a Space-CD.

FIG. 1B illustrates a case where a tapered mask is used. In a substrate 110 illustrated in FIG. 1B, an etching target film 112 and a mask 113 are formed on a base film 111. The mask 113 has a tapered side wall at the bottom of the opening. When an etching is performed on the substrate 110, a bar 112a of the etching target film 112 has a shape in which a CD 114 directly below the mask 113 is larger than a CD 115 of the upper portion, a CD 116 of the middle portion, and a CD 117 of the bottom. Here, the CDs 114 to 117 are Bar-CDs, and a CD 118 of the etched hole is a Space-CD. As illustrated in FIGS. 1A and 1B, when the vertical mask or the tapered mask is used, the vertical processability of the portion immediately below the mask may be deteriorated.

[Substrate Processing Method of the Present Embodiment]

Figure 2:
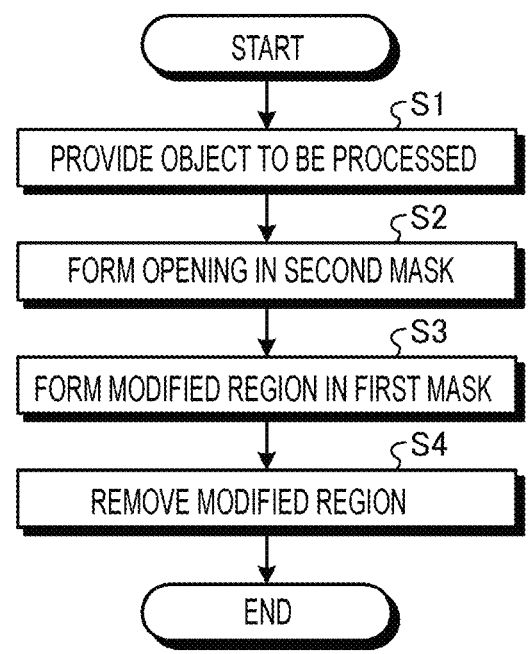
FIG. 2 is a flowchart illustrating an example of a substrate processing method according to an embodiment of the present disclosure.

Next, the substrate processing method according to the present embodiment will be described with reference to FIGS. 2 and 3A to 3D. FIG. 2 is a flowchart illustrating an example of the substrate processing method according to an embodiment of the present disclosure. FIGS. 3A to 3D are views illustrating an example of a pattern formed by the substrate processing method of the present embodiment.

Figure 3:
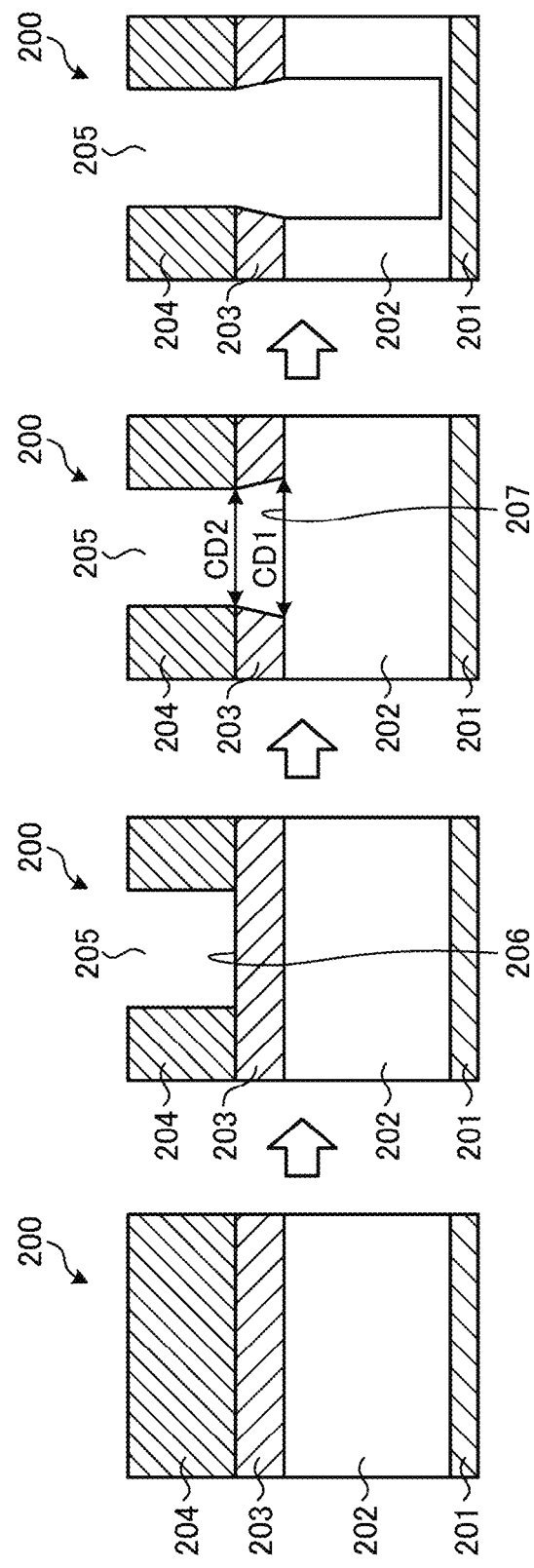
FIGS. 3A to 3D are views illustrating an example of a pattern formed by the substrate processing method according to the present embodiment.

As illustrated in FIG. 2, first, a substrate 200 which is an object to be processed is provided (step S1). As illustrated in FIG. 3A, the substrate 200 includes an etching target film 202, a first mask 203, and a second mask 204 which are formed on a base film 201. The film type of the second mask 204 is different from the first mask 203.

Next, an opening 205 is formed in the second mask 204 (step S2). In step S2, for example, a third mask having an opening (not illustrated) is formed on the second mask 204, and the opening 205 is formed in the second mask 204 by using the third mask. As illustrated in FIG. 3B, the upper surface of the first mask 203 is exposed from the bottom 206 of the opening 205 formed in the second mask 204. When step S1 provides the substrate 200 in a state where the opening 205 is formed in advance in the second mask 204 as the object to be processed, step S2 is omitted.

When the upper surface of the first mask 203 is exposed, the first mask 203 is selectively etched with respect to the second mask 204, and an opening is formed in the first mask 203 such that the Space-CD of at least a portion of the first mask 203 (opening dimension) is larger than the bottom CD of the second mask 204. In this way, when the first mask 203 is etched such that the Space-CD of at least a portion of the first mask 203 is larger than the bottom CD of the second mask 204, for example, deposits adhering during the etching of the etching target film 202 hardly become a shadow, and the etching target film 202 directly below the first mask 203 may be vertically processed.

In an example, as illustrated in FIG. 3C, the first mask 203 is etched up to the upper surface 207 of the etching target film 202, such that the side surface of the first mask 203 has a reverse tapered shape. That is, an etching is performed such that the CD of the bottom of the first mask 203, i.e., the bottom CD1 of the first mask 203 is larger than the CD of the bottom of the second mask 204, i.e., the bottom CD2 of the second mask 204. In this case, the first mask 203 may be anisotropically etched in the vertical direction until or immediately before the etching target film 202 is exposed, so as to form an opening, and then, may be etched to widen the Space-CD of the opening. At this time, the etching may be performed by an ion modification atomic layer etching (ALE) to widen the Space-CD of the opening formed in the first mask 203. In the ion modification ALE, first, a portion of the first mask 203 is modified by first plasma generated from a first gas to form a modified region (step S3). Next, the modified region is removed by second plasma generated from a second gas (step S4).

In another example, the first mask 203 is selectively isotropically etched with respect to the second mask 204, such that a recess is formed in a portion of the side wall of the first mask 203. For example, when the first mask 203 is a silicon-containing film or a metal-containing film, the first mask 203 may be etched by plasma generated from a fluorine-containing gas such as fluorocarbon gas. For example, when the first mask 203 is an organic film, the first mask 203 may be etched by plasma generated from a hydrogen-containing gas or an oxygen-containing gas. Further, the first mask 203 may be etched by adsorbing, for example, HF gas onto the surface of the substrate at a low temperature to react with the surface of the first mask 203, and then, heating the substrate to a high temperature so as to desorb the HF gas after the reaction. The HF gas may be used for both the etching of the silicon-containing film and the etching of the organic film. The HF gas may be applied to a normal dry etching process, in addition to the gas adsorption method described above. That is, the first mask 203 may be etched using plasma generated from the HF gas.

When the etching of the first mask 203 and the etching target film 202 is progressed by repeating steps S3 and S4 described above, the following process may be performed subsequent to step S4. That is, after the modified region of the first mask 203 is removed, a process may be performed to compare the bottom CD1 of the first mask 203 and the bottom CD2 of the second mask 204, and determine whether the bottom CD1 is larger than the bottom CD2, based on the comparison result.

When it is determined that the bottom CD1 is equal to or less than the bottom CD2, the process returns to step S3, and the ion modification ALE of the first mask 203 is continued. Meanwhile, when it is determined that the bottom CD1 is larger than the bottom CD2, it is determined whether the bottom CD1 is equal to or more than a predetermined value. When it is determined that the bottom CD1 is less than the predetermined value, the process returns to step S3, and the ion modification ALE of the first mask 203 is continued. Meanwhile, when it is determined that the bottom CD1 is equal to or more than the predetermined value, the etching target film 202 is etched.

Thereafter, a process may be performed to determine whether to end the etching of the etching target film 202. When the etching target film 202 has not been etched to a predetermined depth, and it is determined not to end the etching, the etching is continued. Meanwhile, when the etching target film 202 has been etched to the predetermined depth, the etching is ended. As for the shape of the opening 205, as illustrated in FIG. 3D, the etching is performed in the vertical direction up to the vicinity of the bottom of the etching target film 202. In this way, by improving the vertical processability of the pattern formed on the substrate 200, the shape abnormality of the pattern may be suppressed.

[Film Type]

In the present embodiment, the film type of each of the etching target film 202, the first mask 203, and the second mask 204 is not particularly limited. The base film 201 may be, for example, the substrate 200 itself, which is a silicon wafer. As for the etching target film 202, for example, a silicon (Si) film, a germanium (Ge)-containing film, an organic film, or a metal-containing film may be used. As for the organic film, for example, a carbon-containing film may be used. The carbon-containing film may be formed of an amorphous carbon layer (ACL) or a spin-on carbon film (SOC). As for the metal-containing film, for example, a titanium (Ti) film or a tungsten (W) film may be used. The etching target film 202 may be formed by stacking a plurality of types of films. For example, the etching target film 202 may be an ONON (silicon oxide film/silicon nitride film) film or an OPOP (silicon oxide film/polysilicon) film.

The first mask 203 may be any mask as long as the etching target film 202 may be selectively etched. The second mask 204 may be any mask as long as the first mask 203 may be selectively etched. For example, as for the first mask 203, a silicon-containing film, an organic film, or a metal-containing film may be used. In this case, the second mask 204 may be any mask as long as the first mask 203 may be selectively etched. More specifically, when a silicon-containing film is used as the first mask 203, a silicon-containing film different from the first mask 203, an organic film, or a metal-containing film may be used as the second mask 204. Examples of the silicon-containing film include a silicon oxide film ($SiO_2$ film), a silicon nitride film (SiN film), a silicon carbide film (SiC film), or a carbon-containing silicon oxide film (SiOC film). In an example, the first mask 203 may be a silicon nitride film, and the second mask 204 may be a silicon oxide film. In another example, the first mask 203 may be a silicon oxide film, and the second mask 204 may be a silicon nitride film. In still another example, one of the first mask 203 and the second mask 204 may be a silicon film, and the other may be a film other than silicon. Additionally, the following combination may be adopted: the first mask 203 is an organic film, and the second mask 204 is a silicon-containing film; or the first mask 203 is a metal-containing film, and the second mask 204 is a silicon-containing film or an organic film.

[Gas Type of Ion Modification ALE]

In the ion modification ALE of the present embodiment, when the first mask 203 is a silicon-containing film or a metal film, for example, at least one selected from the group consisting of He, a hydrogen-containing gas, and a nitrogen-containing gas may be used as a first gas, and a fluorine-containing gas may be used as a second gas. As for the hydrogen-containing gas, at least one selected from the group consisting of $H_2$ gas, $D_2$ gas (deuterium gas), and $NH_3$ gas may be used. As for the fluorine-containing gas, at least one selected from the group consisting of $NF_3$ gas, $SF_6$ gas, and fluorocarbon gas (e.g., $CF_4$ gas) may be used. The second gas may include an oxygen-containing containing gas. As for the oxygen-containing gas, at least one selected from the group consisting of $O_2$ gas, $CO_2$ gas, and CO gas may be used. The second gas may further include a noble gas such as Ar.

In an example, when the first mask 203 is a silicon nitride film, and the second mask 204 is a silicon oxide film, a hydrogen-containing gas may be used as the first gas, and a fluorine-containing gas may be used as the second gas. In this case, the surface of the first mask 203 is irradiated with active species of hydrogen by the first plasma generated from the first gas, so that the vicinity of the surface is modified and becomes the modified region. The modified region is selectively etched and removed by active species of fluorine in the second plasma generated from the second gas.

In another example, when the first mask 203 is a silicon oxide film, and the second mask 204 is a titanium nitride film (TiN film), nitrogen ($N_2$) gas may be used as the first gas, and a mixed gas of $NF_3$, $O_2$, $H_2$, and Ar or a mixed gas of $CH_3F$, $O_2$, $H_2$, and Ar may be used as the second gas. In still another example, when the first mask 203 is silicon carbide, and the second mask 204 is, for example, a silicon nitride film, a germanium-containing film, or a metal-containing film, a nitrogen-containing gas such as $N_2$, $NH_3$, NO, or $NO_2$ may be used as the first gas, and a fluorine-containing gas such as $NF_3$, $SF_6$, or $CF_4$ may be used as the second gas. As for the metal-containing film in this case, for example, titanium (Ti), tungsten (W), hafnium (Hf), zirconium (Zr), or tantalum (Ta) may be used.

[Target Pattern Structure]

Figure 4:
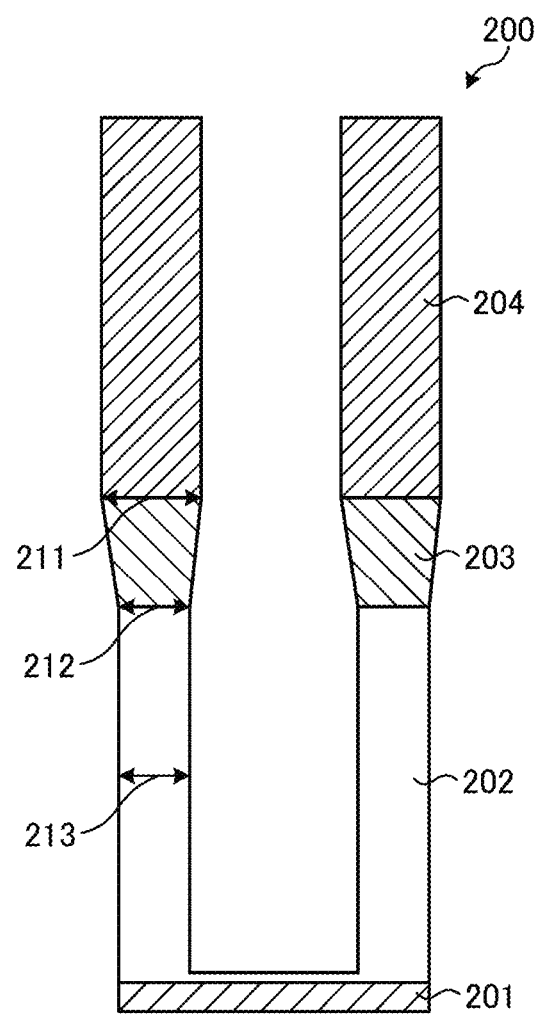
FIG. 4 is a view illustrating an example of a target pattern structure of the present embodiment.

FIG. 4 is a view illustrating an example of a target pattern structure of the present embodiment. The substrate 200 illustrated in FIG. 4 relates to a target pattern structure after the etching of the etching target film 202. In the substrate 200 illustrated in FIG. 4, a target relationship among the bottom CD 211 which is the CD of the bottom of the second mask 204, the bottom CD 212 of the first mask 203, and the bar CD 213 of the etching target film 202 is the bottom CD 211>the bottom CD 212>the bar CD 213. The bottom CD 211, the bottom CD 212, and the bar CD 213 are Bar-CDs. That is, in view of the Space-CD of FIGS. 2 and 3A to 3D, the bottom CD2<the bottom CD1.

[Experimental Results]

Figure 5:
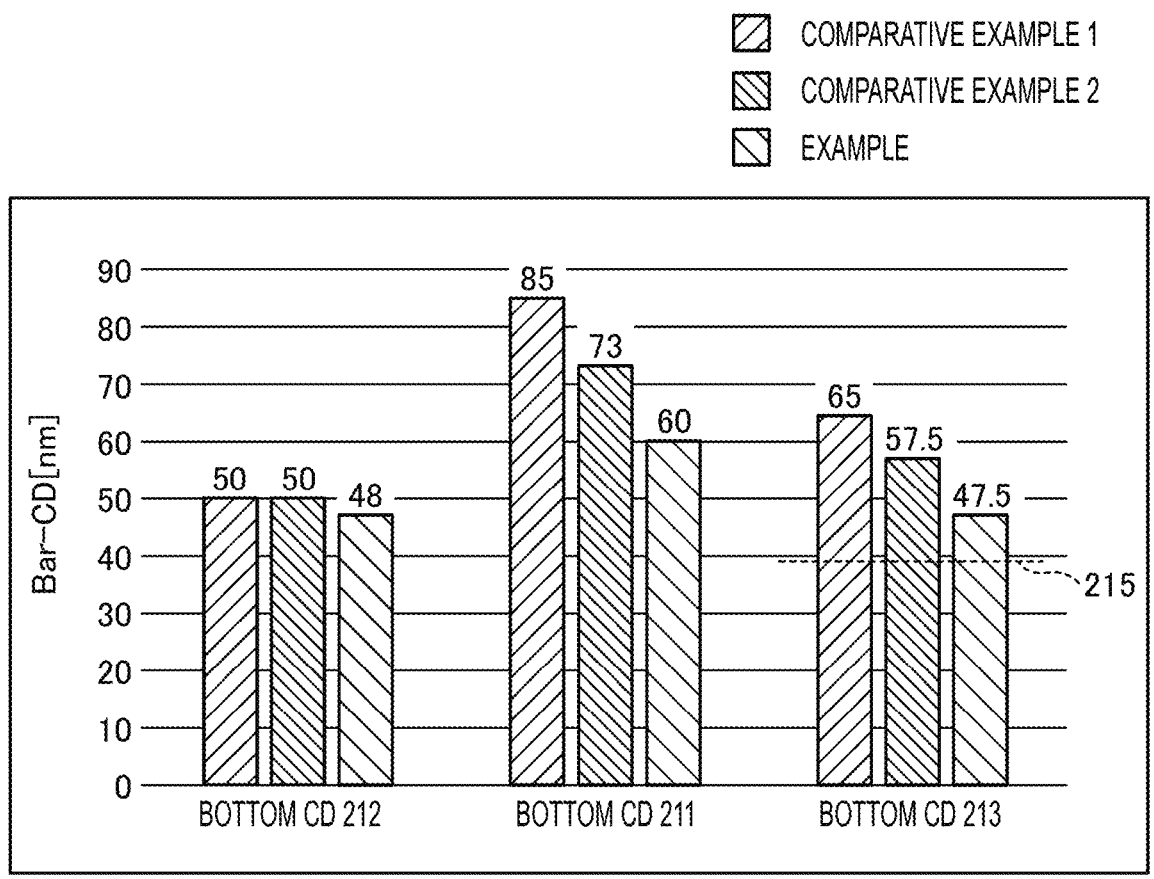
FIG. 5 is a view illustrating an example of experimental results between an Example of the present embodiment and Comparative Examples.

Next, using FIG. 5, descriptions will be made on the bottom CD 211, the bottom CD 212, and the bar CD 213 in an Example in a case where the etching target film 202 is a silicon film, the first mask 203 is a silicon nitride film, and the second mask 204 is a silicon oxide film in the present embodiment. The positions of the bottom CD 211, the bottom CD 212, and the bar CD 213 are the same as those in the substrate 200 of FIG. 4. In FIG. 5, in addition to the Example, Comparative Examples 1 and 2 will be described in which a mask having a tapered side wall at the bottom of the opening (e.g., the mask 113 illustrated in FIG. 1B) is used. A target value 215 of the bar CD 213 is set to 40 nm.

FIG. 5 is a view illustrating an example of experimental results of the Example of the present embodiment and the Comparative Examples. As illustrated in FIG. 5, in the Example, the bottom CD 211 of the second mask 204 is 60 nm, the bottom CD 212 of the first mask 203 is 48 nm, and the bar CD 213 of the etching target film 202 is 47.5 nm. That is, it may be found that the relationship of the bottom CD 211>the bottom CD 212>the bar CD 213 is achieved, the vertical processability of the pattern formed on the substrate 200 may be improved, and the shape abnormality of the pattern may be suppressed.

Meanwhile, in Comparative Example 1, the bottom CD 211 is 85 nm, the bottom CD 212 is 50 nm, and the bar CD 213 is 65 nm. In Comparative Example 1, the bar CD 213 is larger than the bottom CD 212, and the vertical processability of the pattern is deteriorated. In Comparative Example 2, the bottom CD 211 is 73 nm, the bottom CD 212 is 50 nm, and the bar CD 213 is 57.5 nm. In Comparative Example 2 as well, the bar CD 213 is larger than the bottom CD 212, and the vertical processability of the pattern is deteriorated.

[Example of Configuration of Substrate Processing Apparatus]

Figure 6:
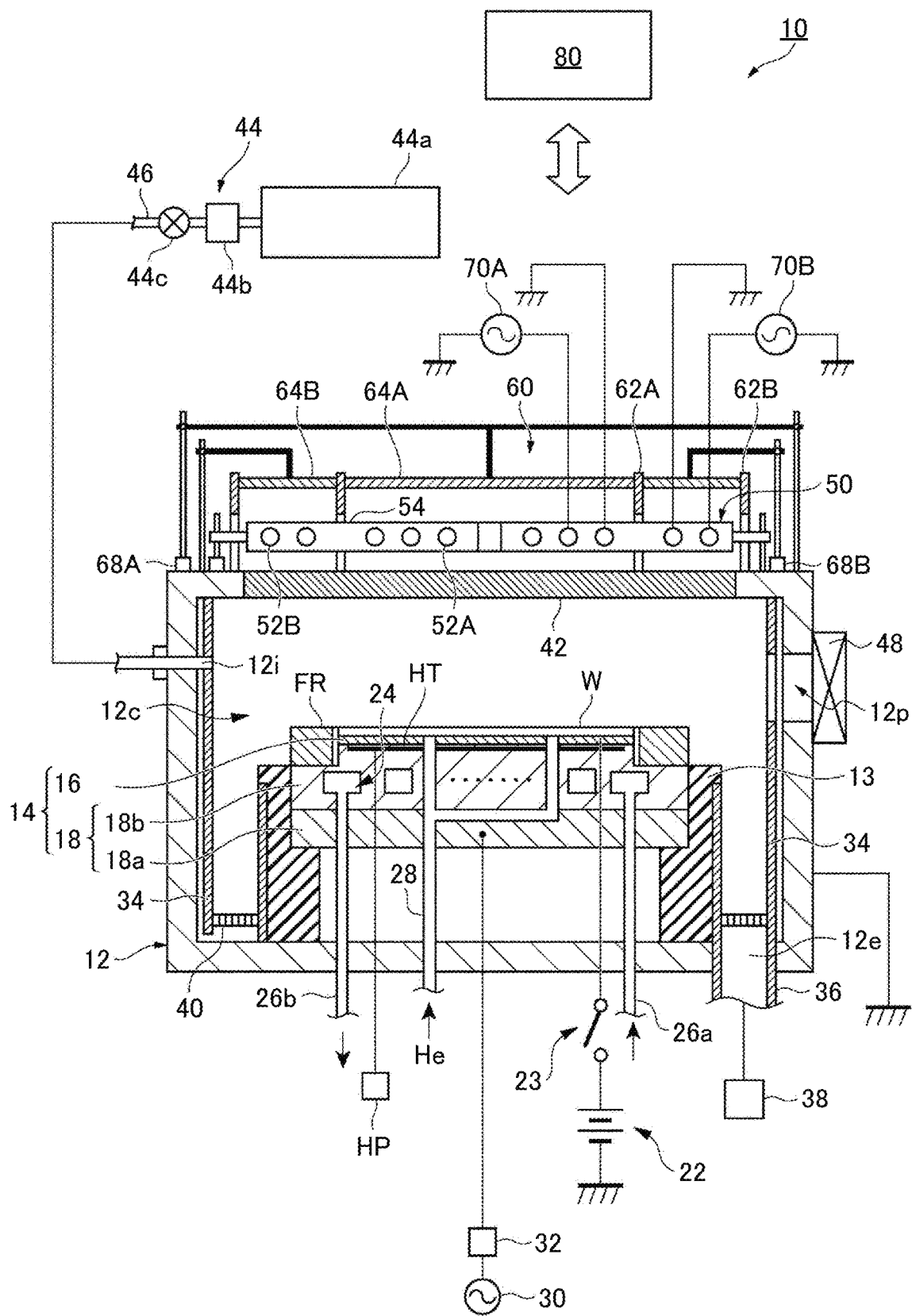
FIG. 6 is a view illustrating an example of the substrate processing apparatus according to the present embodiment.

FIG. 6 is a view illustrating an example of a substrate processing apparatus according to the present embodiment. A substrate processing apparatus 10 illustrated in FIG. 6 may be used to implement the substrate processing method of the embodiment. The substrate processing apparatus 10 illustrated in FIG. 6 is a so-called inductively coupled plasma (ICP) apparatus, and includes a plasma source for generating inductively coupled plasma. However, the substrate processing apparatus according to the embodiment may use plasma generated by another method. For example, the substrate processing apparatus of the embodiment may use capacitively coupled plasma (CCP), electron-cyclotron-resonance (ECR) plasma, helicon wave excited plasma (HWP), or a surface wave plasma (SWP).

The substrate processing apparatus 10 includes a chamber 12. The chamber 12 is formed of a metal such as aluminum. The chamber 12 has, for example, a substantially cylindrical shape. A space 12c in which a processing is performed is provided in the chamber 12.

A substrate support 14 is disposed below the space 12c. The substrate support 14 is configured to hold a substrate W placed thereon. The substrate W is, for example, a substrate to be processed by the method of an embodiment.

The substrate support 14 may be supported by a support mechanism 13. The support mechanism 13 extends upward from the bottom of the chamber 12 in the space 12c. The support mechanism 13 may have a substantially cylindrical shape. The support mechanism 13 may be made of an insulating material such as quartz.

The substrate support 14 includes an electrostatic chuck 16 and a lower electrode 18. The lower electrode 18 includes a first plate 18a and a second plate 18b. The first plate 18a and the second plate 18b are made of a metal such as aluminum. Each of the first plate 18a and the second plate 18b has, for example, a substantially cylindrical shape. The second plate 18b is disposed on the first plate 18a. The second plate 18b is electrically connected to the first plate 18a.

The electrostatic chuck 16 is disposed on the second plate 18b. The electrostatic chuck 16 includes an insulating layer and a thin-film electrode disposed inside the insulating layer. A DC power supply 22 is electrically connected to the thin-film electrode of the electrostatic chuck 16 via a switch 23. The electrostatic chuck 16 generates an electrostatic force from a DC voltage of the DC power supply 22. The electrostatic chuck 16 attracts and holds the substrate W by the generated electrostatic force.

An edge ring FR is disposed on and around the second plate 18b to surround the outer peripheries of the substrate W and the electrostatic chuck 16, during the operation of the substrate processing apparatus 10. The edge ring FR has a function to improve the uniformity of a process. The edge ring FR is made of, for example, silicon.

A flow path 24 is formed in the second plate 18b. A heat exchange medium such as a coolant is supplied to the flow path 24 from a temperature controller (e.g., a chiller unit) disposed outside the chamber 12, for a temperature control. The temperature controller adjusts the temperature of the heat exchange medium. The heat exchange medium is supplied from the temperature controller to the flow path 24 through a pipe 26a. The heat exchange medium supplied from the temperature controller to the flow path 24 through the pipe 26a is sent back to the temperature controller through a pipe 26b. The heat exchange medium is returned to the flow path 24 in the substrate support 14 after the temperature thereof is adjusted by the temperature controller. In this way, the temperature of the substrate support 14, that is, the temperature of the substrate W may be adjusted.

The substrate processing apparatus 10 further includes a gas supply line 28 that extends to the upper surface of the electrostatic chuck 16 while penetrating the substrate support 14. A heat exchange gas such as helium (He) gas is supplied from a heat exchange gas supply mechanism to the space between the upper surface of the electrostatic chuck 16 and the lower surface of the substrate W, through the gas supply line 28. In this way, the heat exchange between the substrate support 14 and the substrate W is promoted.

A heater HT may be disposed in the substrate support 14. The heater HT is a heating device. The heater HT is embedded in, for example, the second plate 18b or the electrostatic chuck 16. The heater HT is connected to a heater power supply HP. When the heater power supply HP supplies a power to the heater HT, the temperature of the substrate support 14, and furthermore, the temperature of the substrate W are adjusted.

A radio-frequency (RF) power supply 30 is connected to the lower electrode 18 of the substrate support 14 via a matching device 32. Current may be supplied from the RF power supply 30 to the lower electrode 18. The RF power supply 30 generates an RF power to draw ions into the substrate W placed on the substrate support 14. That is, the RF power supply 30 generates RF current which is a bias voltage. The frequency of the RF current generated by the RF power supply 30 falls within a range of, for example, 400 kHz to 40.68 MHz. In an example, the frequency of the RF power may be 13.56 MHz.

The substrate processing apparatus 10 further includes a shield 34 detachably attached to the inner wall of the chamber 12. The shield 34 is disposed to surround the outer periphery of the support mechanism 13. The shield 34 suppresses by-products produced by a processing from adhering to the chamber 12. The shield 34 may be an aluminum member coated with ceramics such as $Y_2O_3$.

An exhaust path is formed between the substrate support 14 and the side wall of the chamber 12. The exhaust path is connected to an exhaust port 12e formed at the bottom of the chamber 12. The exhaust port 12e is connected to an exhaust device 38 via a pipe 36. The exhaust device 38 includes a pressure controller and a vacuum pump such as a turbo molecular pump (TMP). A baffle plate 40 is disposed in the exhaust path, that is, between the substrate support 14 and the side wall of the chamber 12. The baffle plate 40 has a plurality of through holes penetrating the baffle plate 40 in the thickness direction thereof. The baffle plate 40 may be an aluminum member of which surface is coated with ceramics such as $Y_2O_3$.

An opening is formed in the upper side of the chamber 12. The opening is closed by a window 42. The window 42 is formed of, for example, a dielectric such as quartz. The window 42 is, for example, a flat plate.

A gas intake port 12i is formed in the side wall of the chamber 12. The gas intake port 12i is connected to a gas supply 44 via a pipe 46. The gas supply 44 supplies various gases used for a processing to the space 12c. The gas supply 44 includes a plurality of gas sources 44a, a plurality of flow controllers 44b, and a plurality of valves 44c. Although not explicitly illustrated in FIG. 6, a plurality of different gas intake ports may be provided for gases to be supplied, respectively, such that the gases do not mix with each other.

The plurality of gas sources 44a include gas sources of various gases to be described later. One gas source may supply one or more gases. The plurality of flow controllers 44b may be mass flow controllers (MFC). Each flow rate controller 44b implements the flow rate control through a pressure control. Each gas source included in the plurality of gas sources 44a is connected to the gas intake port 12i via one corresponding flow controller among the plurality of flow controllers 44b and one corresponding valve among the plurality of valves 44c. The position of the gas intake port 12*i* is not particularly limited. For example, the gas intake port 12*i* may be formed in the window 42, rather than in the side wall of the chamber 12.

An opening 12*p* is formed in the side wall of the chamber 12. The opening 12*p* serves as a carry-in/out passage for the substrate W, through which the substrate W is carried into the space 12*c* of the chamber 12 from the outside, and carried out from the inside of the space 12*c* to the outside of the chamber 12. A gate valve 48 is provided on the side wall of the chamber 12, to open and close the opening 12*p*.

An antenna 50 and a shield 60 for shielding the antenna 50 are disposed on the chamber 12 and the window 42. The antenna 50 and the shield 60 are arranged outside the chamber 12 and on the window 42. In an embodiment, the antenna 50 includes an inner antenna element 52A and an outer antenna element 52B. The inner antenna element 52A is a spiral coil disposed in the center of the window 42. The outer antenna element 52B is a spiral coil disposed above the window 42 on the outer peripheral side of the inner antenna element 52A. The inner antenna element 52A and the outer antenna element 52B are each made of a conductive material such as copper, aluminum, or stainless steel.

The inner antenna element 52A and the outer antenna element 52B are connected to RF power supplies 70A and 70B, respectively. The inner antenna element 52A and the outer antenna element 52B are supplied with a power of the same frequency or powers of different frequencies from the RF power supplies 70A and 70B, respectively. When an RF power is supplied from the RF power supply 70A to the antenna 50, an induced magnetic field is generated in the space 12*c*, and a processing gas in the space 12*c* is excited to generate plasma above the substrate W.

The substrate processing apparatus 10 further includes a controller 80. The controller 80 may be a computing device provided with, for example, a processor, a storage unit such as a memory, an input unit, and a display. The controller 80 operates based on control programs or recipe data stored in the storage unit and controls each component of the substrate processing apparatus 10. For example, the controller 80 controls, for example, the plurality of flow controllers 44*b*, the plurality of valves 44*c*, the exhaust device 38, the RF power supplies 70A and 70B, the RF power supply 30, the matching device 32, and the heater power supply HP. When the substrate processing method of the embodiment is implemented, the controller 80 may control each component of the substrate processing apparatus 10 based on the control programs or the recipe data.

[Effects]

As described above, according to the present embodiment, the substrate processing method includes: (a) providing the substrate 200 including the etching target film 202, the first mask 203 formed on the etching target film 202, and the second mask 204 formed on the first mask 203, being different in film type from the first mask 203, and having an opening; (b) selectively etching the first mask 203 with respect to the second mask 204, thereby forming an opening in the first mask such that the opening dimension (bottom CD1) of at least a portion of the first mask 203 is larger than the opening dimension (bottom CD2) of the bottom of the second mask 204; and (c) etching the etching target film 202. As a result, the vertical processability of the pattern formed on the substrate 200 may be improved, so that the shape abnormality of the pattern may be suppressed.

According to the present embodiment, in (b), the first mask is etched such that the opening dimension of the bottom of the first mask is larger than the opening dimension of the bottom of the second mask. As a result, the vertical processability of the pattern formed on the substrate 200 may be improved, so that the shape abnormality of the pattern may be suppressed.

According to the present embodiment, the opening of the first mask has a reverse tapered shape. As a result, the vertical processability of the pattern formed on the substrate 200 may be improved.

According to the present embodiment, the first mask is a silicon-containing film, an organic film, or a metal-containing film. As a result, the vertical processability of the pattern formed on the substrate 200 may be improved, so that the shape abnormality of the pattern may be suppressed.

According to the present embodiment, the first mask 203 is a silicon-containing film, and the second mask 204 is a silicon-containing film different from the first mask 203, an organic film, or a metal-containing film. As a result, the first mask 203 may be etched into the reverse tapered shape.

According to the present embodiment, the first mask 203 is a silicon nitride film, a silicon oxide film, or a silicon carbide film, and the second mask 204 is a silicon-containing film different from the first mask. As a result, the first mask 203 may be etched into the reverse tapered shape.

According to the present embodiment, in (b), a sequence is performed once or more times, which includes (b-1) modifying a portion of the first mask 203 with the first plasma generated from the first gas to form the modified region, and (b-2) removing the modified region with the second plasma generated from the second gas. As a result, the first mask 203 may be etched into the reverse tapered shape by the ion modification ALE.

According to the present embodiment, the first mask is a silicon-containing film or a metal-containing film, the first gas is helium gas, hydrogen-containing gas, or nitrogen-containing gas, and the second gas is fluorine-containing gas. As a result, the first mask 203 may be etched into the reverse tapered shape by the ion modification ALE.

According to the present embodiment, the hydrogen-containing gas is at least one selected from the group consisting of $H_2$ gas, $D_2$ gas, and $NH_3$ gas, and the fluorine-containing gas is at least one selected from the group consisting of $NF_3$ gas, $SF_6$ gas, and fluorocarbon gas. As a result, the first mask 203 may be etched into the reverse tapered shape by the ion modification ALE.

According to the present embodiment, the second gas further includes an oxygen-containing gas. As a result, the first mask 203 may be etched into the reverse tapered shape by the ion modification ALE.

According to the present embodiment, the oxygen-containing gas is at least one selected from the group consisting of $O_2$ gas, $CO_2$ gas, and CO gas. As a result, the first mask 203 may be etched into the reverse tapered shape by the ion modification ALE.

According to the present embodiment, (b) is a step of isotropically etching the first mask using an etching gas. As a result, the first mask 203 may be etched into the reverse tapered shape.

According to the present embodiment, (a) includes: (a-1) providing a substrate including an etching target film, a first mask, a second mask formed on the first mask and being different in film type from the first mask, and a third mask formed on the second mask and having an opening; and (a-2) forming an opening in the second mask by using the third mask. As a result, the vertical processability of the pattern formed on the substrate 200 may be improved, so that the shape abnormality of the pattern may be suppressed.

The embodiments disclosed herein are merely examples, and should not be construed as limiting the present disclosure, in all aspects. The embodiments may be omitted, substituted, or modified in various forms without departing from the scope and gist of the claims attached thereto.

In the embodiments described above, the first mask 203 is etched by the ion modification ALE. However, the present disclosure is not limited thereto. For example, the first mask 203 may be etched into the reverse tapered shape by combining a mask formation on a pattern through, for example, an atomic layer deposition (ALD), a sub-conformal ALD, or a chemical vapor deposition (CVD), and the isotropic etching.

According to the present disclosure, the shape abnormality of a pattern formed on a substrate may be suppressed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
   (a) providing a substrate including an etching target film, a first mask formed on the etching target film, and a second mask formed on the first mask, the second mask being different in film type from the first mask and having an opening;
   (b) selectively etching the first mask with respect to the second mask, thereby forming an opening in the first mask such that an opening dimension of at least a portion of the first mask is larger than an opening dimension of a bottom of the second mask; and
   (c) etching the etching target film.

2. The substrate processing method according to claim 1, wherein, in (b), the first mask is etched such that an opening dimension of a bottom of the first mask is larger than the opening dimension of the bottom of the second mask.

3. The substrate processing method according to claim 2, wherein the opening of the first mask has a reverse tapered shape.

4. The substrate processing method according to claim 1, wherein the first mask is a silicon-containing film, an organic film, or a metal-containing film.

5. The substrate processing method according to claim 1, wherein the first mask is a silicon-containing film, and
   the second mask is a silicon-containing film different from the first mask, an organic film, or a metal-containing film.

6. The substrate processing method according to claim 1, wherein the first mask is a silicon nitride film, a silicon oxide film, or a silicon carbide film, and
   the second mask is a silicon-containing film different from the first mask.

7. The substrate processing method according to claim 1, wherein, in (b), a sequence is performed once or more times, the sequence including
   (b-1) modifying a portion of the first mask with first plasma generated from a first gas, thereby forming a modified region, and
   (b-2) removing the modified region with second plasma generated from a second gas.

8. The substrate processing method according to claim 7, wherein the first mask is a silicon-containing film or a metal-containing film,
   the first gas includes helium gas, a hydrogen-containing gas, or a nitrogen-containing gas, and
   the second gas includes a fluorine-containing gas.

9. The substrate processing method according to claim 8, wherein the hydrogen-containing gas is at least one selected from the group consisting of H2 gas, D2 gas, and NH3 gas, and
   the fluorine-containing gas is at least one selected from the group consisting of NF3 gas, SF6 gas, and fluorocarbon gas.

10. The substrate processing method according to claim 7, wherein the second gas further includes an oxygen-containing gas.

11. The substrate processing method according to claim 10, wherein the oxygen-containing gas is at least one selected from the group consisting of $O_2$ gas, $CO_2$ gas, and CO gas.

12. The substrate processing method according to claim 1, wherein, in (b), the first mask is isotropically etched by using an etching gas.

13. The substrate processing method according to claim 1, wherein (a) includes
   (a-1) providing a substrate including the etching target film, the first mask, a second mask formed on the first mask and being different in film type from the first mask, and a third mask formed on the second mask and having an opening, and
   (a-2) forming the opening in the second mask by using the third mask.

14. The substrate processing method according to claim 1, wherein the selectively etching the first mask of (b) includes forming the opening in the first mask using an isotropic etching and widening a space-CD of the opening using an ion modification ALE (Atomic Layer Etching).

15. The substrate processing method according to claim 14, wherein the widening the space-CD of the opening includes modifying the portion of the first mask using a first plasma generated from a first gas and removing the portion of the first mask modified by the first plasma using a second plasma generated from a second gas.

16. The substrate processing method according to claim 15, wherein the modifying and removing are repeatedly performed, and, after the removing the portion of the first mask, the method further comprises comparing a bottom CD of the first mask and a bottom CD of the second mask, and determining whether the bottom CD of the first mask is larger than the bottom CD of the second mask based on a result of the comparing.

17. The substrate processing method according to claim 16, wherein when determined that the bottom CD of the first mask is equal to or less than the bottom CD of the second mask, the method further comprises repeating the modifying the portion of the first mask and removing the portion of the first mask.

* * * * *